(12) United States Patent
Lu

(10) Patent No.: US 8,201,049 B2
(45) Date of Patent: Jun. 12, 2012

(54) LOW DENSITY PARITY CHECK (LDPC) DECODER

(75) Inventor: Ruifeng Lu, Shanghai (CN)

(73) Assignee: Montage Technology Inc., San Jose, CA (US)

( * ) Notice: Subject to any disclaimer, the term of this patent is extended or adjusted under 35 U.S.C. 154(b) by 1134 days.

(21) Appl. No.: 12/036,219

(22) Filed: Feb. 23, 2008

(65) Prior Publication Data

US 2009/0217125 A1  Aug. 27, 2009

(51) Int. Cl.
*H03M 13/00* (2006.01)
(52) U.S. Cl. ............................. 714/755; 714/786
(58) Field of Classification Search ............. 714/755, 714/786
See application file for complete search history.

(56) References Cited

U.S. PATENT DOCUMENTS 7,137,060 B2 * 11/2006 Yu et al. .................... 714/794
2008/0104474 A1 * 5/2008 Gao et al. ................... 714/752

* cited by examiner

*Primary Examiner* — Guy Lamarre
(74) *Attorney, Agent, or Firm* — Ivy Mei; The Law Office of Ivy Mei

(57) ABSTRACT

Methods and apparatuses to perform iterative decoding of Low Density Parity Check (LDPC) codes based on selecting a lambda number of minimum values. In one aspect, an LDPC decoder is configured for: sorting a plurality of incoming messages of a check node according to magnitudes of the incoming messages; identifying a predetermined number of unique message magnitudes from the incoming messages; and computing outgoing messages for a subset of the plurality of incoming message, where the messages of the subset have different magnitudes larger than the predetermined number of unique message magnitudes but the outgoing messages are computed to have the same magnitude. In at least one example, the decoder is further configured for computing outgoing messages that have magnitudes equal to any of the predetermined number of unique message magnitudes. In general, the magnitudes computed for all outgoing messages may not necessarily be the same.

20 Claims, 5 Drawing Sheets

LOW DENSITY PARITY CHECK (LDPC) DECODER

FIELD OF THE TECHNOLOGY

At least some embodiments of the disclosure relate to Low Density Parity Check (LDPC) Decoders in general and, particularly but not limited to, iterative decoding of LDPC codes.

BACKGROUND

Data communication systems have been under development for many years. Many communication systems employ error-correcting codes, such as LDPC (Low Density Parity Check) codes, to improve reliability and efficiency.

There are many known algorithms for iterative decoding of LDPC codes. A generic message-passing algorithm, called "sum-product algorithm", performs iterative decoding through exchanging messages between nodes of a factor graph along the edges of the graph and updating these messages at the nodes based on the incoming messages. Details about sum-product algorithm can be found in publications, such as: R. G. Gallager, "Low-density parity-check codes," Ph.D. dissertation, Department of Electrical Engineering, M.I.T., Cambridge, Mass., July 1963; F. R. Kschischang, B. J. Frey, H. A. Loeliger, "Factor Graphs and the Sum-Product Algorithm," IEEE Trans. on Information Theory, Volume IT-47, No. 2, February 2001; and European Telecommunications Standards Institute (ETSI) EN 302 307, Digital Video Broadcasting (DVB), V1.1.1 (2005-03).

To improve performance or to reduce complexity, some modified algorithms have been proposed, such as, min-sum algorithm and lambda-min algorithm described in: Marc P. C. Fossorier, "Reduced Complexity Iterative Decoding of Low-Density Parity Check Codes Based on Belief Propagation" published in IEEE Transactions on Communications, vol. 47, No. 5, May 1999; F. Guilloud, E. Boutillon, and J. Danger, "Lambda-Min Decoding Algorithm of Regular and Irregular LDPC Codes," In Proc. 3rd International Symposium on Turbo Codes & Related Topics, pages 451-454, Brest, France, September 2003; and U.S. Patent Application Publication No. 2005/0138519 by Boutillon et al.

The above mentioned references are incorporated herein by references.

SUMMARY OF THE DESCRIPTION

Methods and apparatuses to perform iterative decoding of Low Density Parity Check (LDPC) codes based on selecting a lambda number of minimum values are described herein. Some embodiments are summarized in this section.

In one aspect, a Low Density Parity Check (LDPC) decoder, includes: means for sorting a plurality of incoming messages of a check node according to magnitudes of the incoming messages; means for identifying a predetermined number of unique message magnitudes from the incoming messages; and means for computing outgoing messages for a subset of the plurality of incoming message, where the messages of the subset have different magnitudes larger than the predetermined number of unique message magnitudes but the outgoing messages are computed to have the same magnitude. In at least one embodiment, the decoder also includes means for computing outgoing messages for other incoming messages, such as the incoming messages that have magnitudes equal to any of the predetermined number of unique message magnitudes. In general, the magnitudes of all outgoing messages computed for the corresponding incoming messages may not necessarily be the same.

In one embodiment, the same magnitude of the outgoing messages is equal to a magnitude generated from combining the plurality of incoming messages one after another according to a function.

In one embodiment, the function generates a magnitude from a sum of a smaller one of two input message magnitudes and a value computed based on a sum of the two input message magnitudes and a value computed based on a difference in the two input message magnitudes. For example, the function can generate the magnitude that is equal to that of $\min(a, b) + \log[1+\exp(-a-b)] - \log[1+\exp(a-b)]$, where a and b represent two input message magnitudes, and a is not smaller than b.

In one embodiment, the means for computing the outgoing messages corresponding to the subset includes: means for storing an intermediate result; and means for computing each of the outgoing messages from the intermediate result and a sign of a corresponding message of the subset.

In one embodiment, the decoder further includes: means for determining and storing an intermediate result from combining messages of the selected subset; and means for determining outgoing messages for the corresponding incoming messages not in the subset using the intermediate result.

In one embodiment, a method implemented in a Low Density Parity Check (LDPC) decoder, includes: sorting a plurality of incoming messages of a check node according to message magnitude; selecting a subset of messages from the plurality of incoming messages according to a predetermined number, where the selected subset has message magnitudes larger than the predetermined number of unique message magnitudes of the incoming messages; and computing outgoing messages corresponding to the selected subset, where messages of selected subset have different magnitudes but the outgoing messages are computed to have a same magnitude. In at least one embodiment, the decoder also includes means for computing outgoing messages for other incoming messages, such as the incoming messages that have magnitudes equal to any of the predetermined number of unique message magnitudes. In general, the magnitudes of outgoing messages computed for the corresponding incoming messages may not necessarily be the same.

In one embodiment, the same magnitude of the outgoing messages is equal to a result generated from combining the plurality of incoming messages one after another using a function, which includes generating a result message magnitude from adding a smaller one of two input message magnitudes and a value looked up based on a sum of the two input message magnitudes and a difference in the two input message magnitudes.

In one embodiment, the combining the plurality of incoming message to generate the result comprises using the function to combine two of the incoming messages to generate an intermediate result, which is further combined with another incoming message using the function to generate a further intermediate result.

In one embodiment, the function is equal to $\text{sign}(a) \times \text{sign}(b) \times [\min(|a|, |b|) + \log(1+\exp(-|a+b|)) - \log(1+\exp(-|a-b|))]$, where a and b represent input messages for the function.

In one embodiment, the computing of the outgoing messages corresponding to the selected subset includes changing a sign of an intermediate result according to signs of messages of the selected subset to generate corresponding outgoing messages.

In one embodiment, the method further includes: determining an intermediate result from combining messages of the selected subset one after another using a function, where a subsequent message is combined with a previous result generated from combining using the function; and determining outgoing messages for the corresponding incoming messages other than the subset using the intermediate result.

In one embodiment, an outgoing message for a particular incoming message (which may be called a first incoming message) that is not in the subset is determined without using the first incoming message.

The disclosure includes methods and apparatuses which perform these methods, including data processing systems which perform these methods, and computer readable media containing instructions which when executed on data processing systems cause the systems to perform these methods.

Other features will be apparent from the accompanying drawings and from the detailed description which follows.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the disclosure are not necessarily references to the same embodiment; and, such references mean at least one.

One embodiment of the disclosure provides an iterative method for LDPC decoding. Decoders according embodiments of the disclosure offer improved performance with reduced hardware complexity and less memory cost.

In one embodiment, an LDPC decoder performs iterative decoding according to the bipartite graph of an LDPC code system. In one embodiment, processing nodes and communication connections are arranged according to the bipartite graph of an LDPC code system, as illustrated in FIG. 1.

Figure 1:
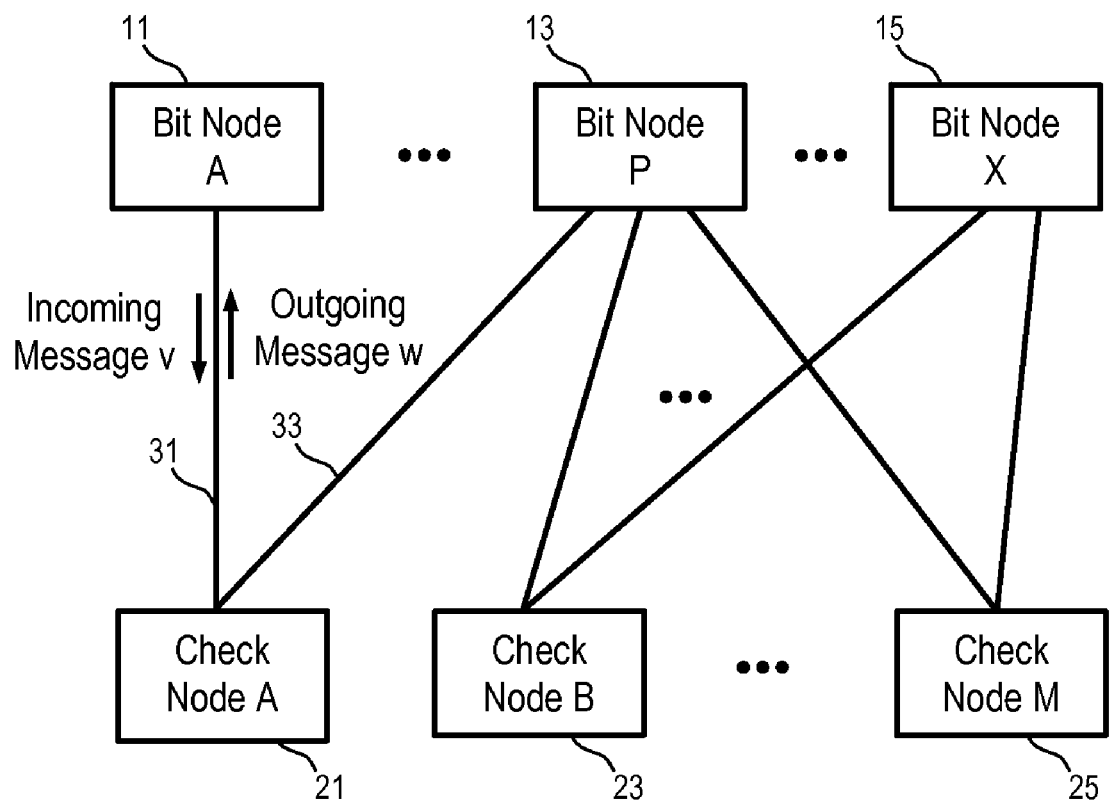
FIG. 1 illustrates a portion of a Density Parity Check (LDPC) Decoder according to one embodiment.

In FIG. 1, a bipartite graph of an LDPC code system includes a set of bit nodes (e.g., 11, 13, ..., 15) and a set of check nodes (e.g., 21, 23, ..., 25). The bit nodes correspond to participating bits of the LDPC codes; and the check nodes correspond to constrains (e.g., check equations) imposed on the participating bits by the LDPC codes. The communication paths (31, 33, ...) correspond to the participation of the corresponding participating bits (bit nodes) in the corresponding constrains (check nodes).

In one embodiment, the iterative decoding process involves the bit nodes and check nodes communicate with each other to determine the transmitted values of the bits. For example, the decoding can start by assigning the channel values as the incoming messages (e.g., v) for the check nodes along the paths/edges from the bit nodes to the check nodes. Upon receiving the incoming messages, the check nodes use the parity check equations to determine check node updates and send them back to the corresponding bit nodes as the outgoing messages (e.g., w). Each bit node then performs a soft majority vote among the information reaching the bit node. At this point, if the hard decisions on the bits satisfy all of the parity check equations, a valid codeword is considered to be found and the iterative process stops. Otherwise bit nodes sends the result of their soft majority votes to the check nodes as the incoming messages and receive updates as the outgoing messages from the check nodes.

In one embodiment, the sign of a message (e.g., v or w) represents the hard decision on the transmitted bit, while the magnitude of the message (e.g., v or w) indicates the reliability of the decision. In one embodiment, the larger is the magnitude, the higher the reliability.

Thus, the LDPC decoding process generally includes computation stages such as bit node initialization, check node update, bit node update, and hard decision. At least some of the stages can be implemented in a way similar to known methods, such as sum-product algorithm, min-sum algorithm and lambda-min algorithm.

For example, in the initialization stage, the bit nodes (e.g., 11, 13, ..., 15) can be configured to set the values of the corresponding bit nodes according to the data obtained from a transmission channel. The values of the corresponding bit nodes are then sent to the check nodes along the paths (e.g., 31, 33, ...) to the check nodes according to their participation in the constrains (e.g., parity check equations).

In the check node update stage, each check node determines an outgoing message (e.g., w) for each incoming message (e.g., v). Details about check node update stage are provided further below.

In the bit node update stage, each bit node determines an updated incoming message for corresponding check nodes based on the outgoing message received from the check nodes during the previous check node update stage.

For example, the outgoing message from a bit node to a check node can be updated by summing the value at the bit node and the outgoing messages previously received by the bit node from check nodes other than the check node.

After the bit node updates, the hard decisions are made based on the incoming messages and outgoing messages at the check nodes. If the hard decisions satisfy all the parity check equations, a valid codeword is found. Otherwise, another round of check node/bit node update is performed. If no convergence is achieved after a pre-determined number of iterations, the current output is provided as the solution.

Although FIG. 1 illustrates an example of using multiple hardware nodes to perform LDPC decoding, the processes described herein can also be implemented using instructions running on one processor or multiple parallel processors.

In one embodiment, a check node update stage is performed according to a design parameter lambda, which is a predetermined number. The incoming messages received at a check node are sorted according to their magnitudes to identify the predetermined number of unique, smallest magnitudes among the magnitudes of the received incoming message. The outgoing messages for incoming messages that have magnitudes equal to one of the identified smallest magnitudes are computed according to one formula; and the outgoing messages for other incoming messages are computed according to another formula.

Figure 2:
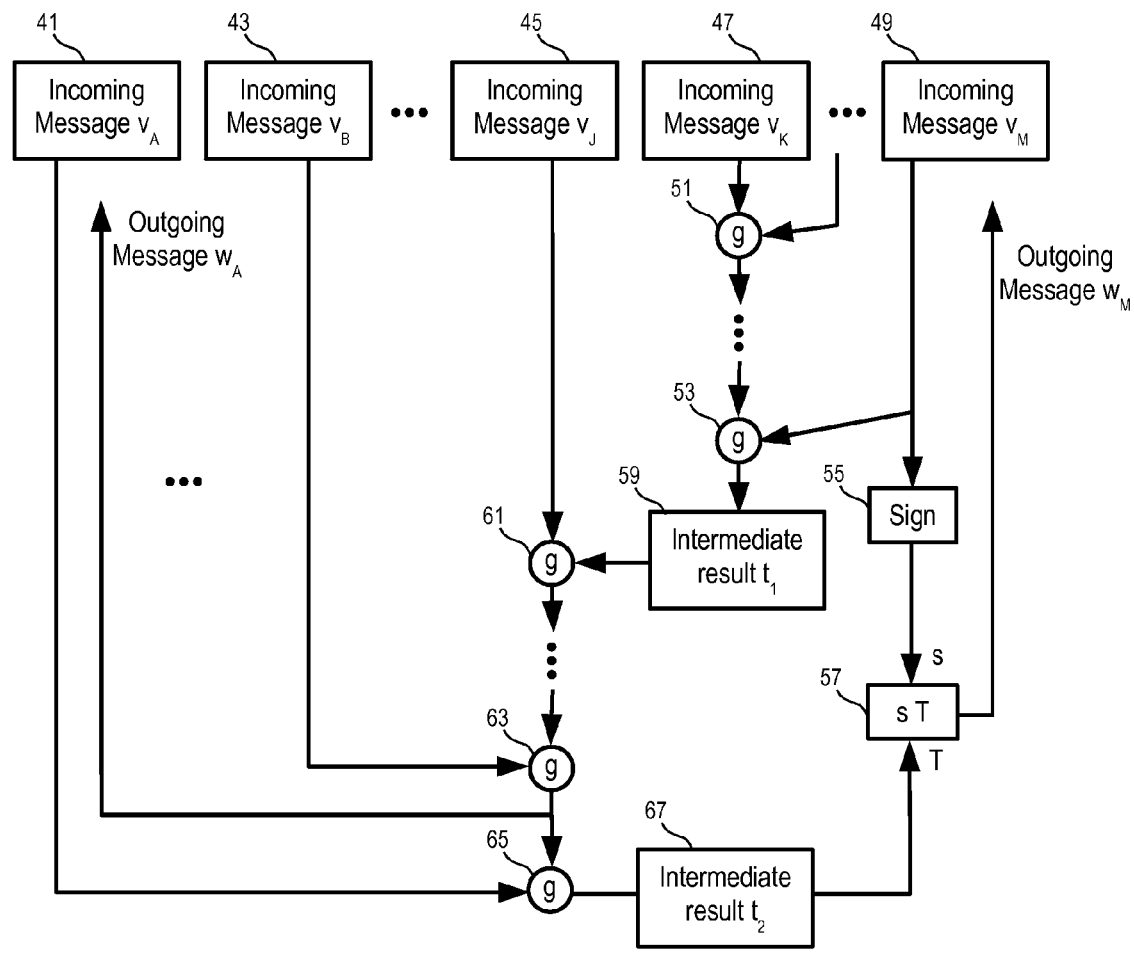
FIG. 2 illustrates a process to generate check node updates according to one embodiment.

FIG. 2 illustrates a process to generate check node updates according to one embodiment. In FIG. 2, the incoming messages (41, 43, ..., 45, 47, ..., 49) have been sorted and identified according to their magnitudes. Each of the incoming messages (41, 43, ..., 45) has a magnitude equal to one of the predetermined number of smallest magnitudes. Incoming messages (47, ..., 49) have magnitudes larger than the predetermined number of smallest magnitudes.

In FIG. 2, the function g (e.g., 51, ..., 53, 61, ..., 63, 65) represents a predetermined function that combines two incoming message to generate a message, which may be further combined with an incoming message using the predetermined function.

In FIG. 2, the set of functions (51, ..., 53) combines the set of incoming messages (47, ..., 49) that have magnitudes larger than the predetermined number of smallest magnitudes. The function (53) generates an intermediate result (59) which can be stored and then repeatedly used for computing the output message for each of the incoming messages (41, 43, ..., 45) which has a magnitude equal to one of the predetermined number of smallest magnitudes.

For example, the set of functions (61, ..., 63) combines the intermediate result (59) and the incoming messages (43, ..., 45) to generate the outgoing message that correspond to the incoming message (41). The outgoing message is to be sent to the bit node which sent the incoming message (41).

Similarly, the intermediate result (59) can be combined with incoming messages (41, 45, ...) but not the incoming message (43) to determine an outgoing message corresponding to the incoming message (43).

In FIG. 2, the set of functions (61, ..., 63 and 65) combines the intermediate result (59) and the incoming messages (41, 43, ..., 45) to generate another intermediate result (67) which is used to compute the outgoing messages for the incoming messages (47, ..., 49) that have magnitudes larger than the predetermined number of smallest magnitudes. The intermediate result (67) represents a combination of all incoming messages (41, 43, ..., 45, 47, ..., 49) that are received at the check node.

For example, in FIG. 2, the sign of the intermediate result (67) can be selectively changed according to the sign (55) of the incoming message (49) to generate the outgoing message corresponding to the incoming message (49). If the sign (55) of the incoming message (49) is positive, the sign (55) of the incoming message (49) is not change. If the sign (55) of the incoming message (49) is negative, the sign (55) of the incoming message (49) is reversed. The outgoing message is to be sent to the bit node which sent the incoming message (49).

In one embodiment, the sign of the intermediate result (67) can be selectively changed according to the sign of any of the incoming messages (47, ..., 49) to generate an output message for the corresponding incoming message, where the incoming messages (47, ..., 49) have magnitudes larger than the predetermined number of smallest magnitudes.

In some embodiments, the functions (51, ..., 53, 61, ..., 63, 65) are implemented using separate circuit units. In some embodiments, the functions (51, ..., 53, 61, ..., 63, 65) can be implemented using one circuit unit with a loop to accumulate the result by combining the incoming messages one at a time. In some embodiments, the functions (51, ..., 53, 61, ..., 63, 65) can be implemented using a plurality of circuit units perform some of the combinations in parallel and combining the results in serial. In some embodiments, the functions (51, ..., 53, 61, ..., 63, 65) can be implemented using one or more processors controlled using a set of instructions. Thus, the disclosure is not limited to a particular type of implementation, in software and/or in hardware.

Figure 3:
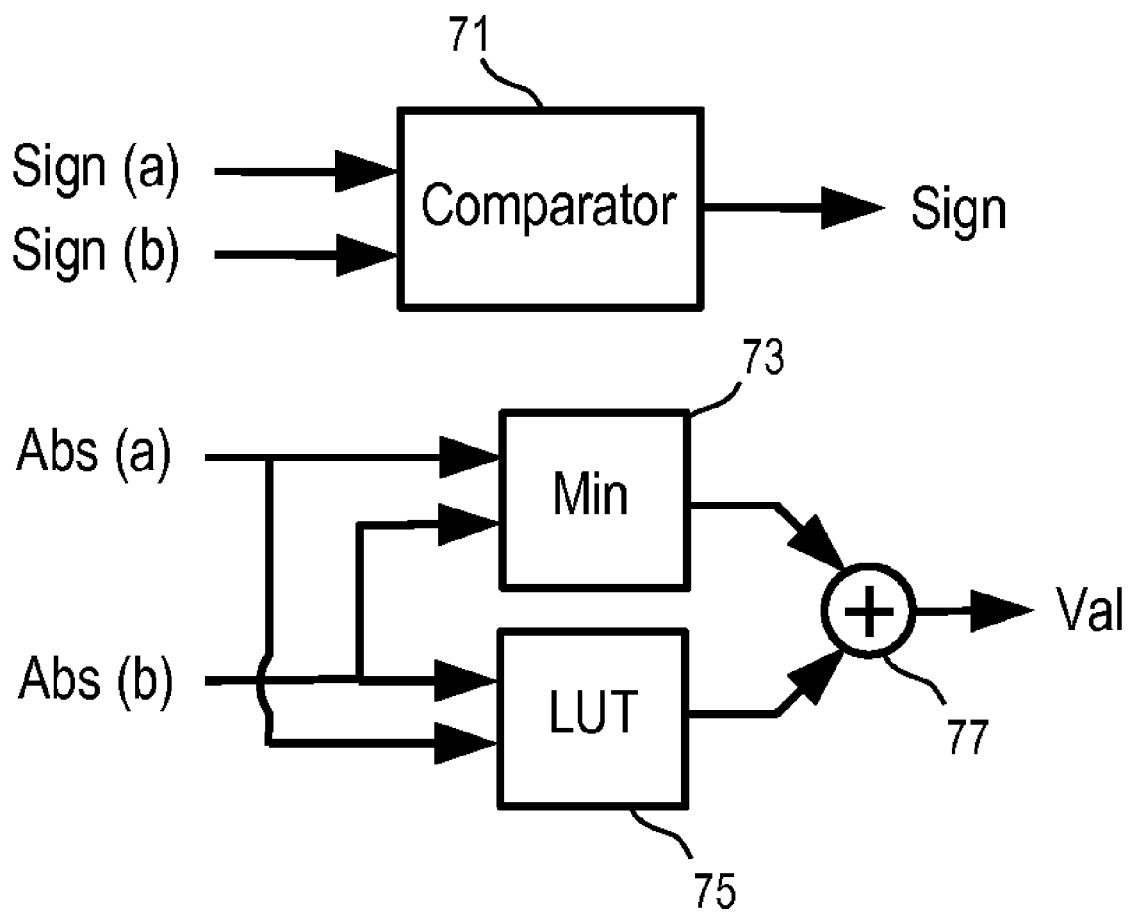
FIGS. 3-4 illustrates an implementation of a function to combine to messages according to one embodiment.
Figure 4:
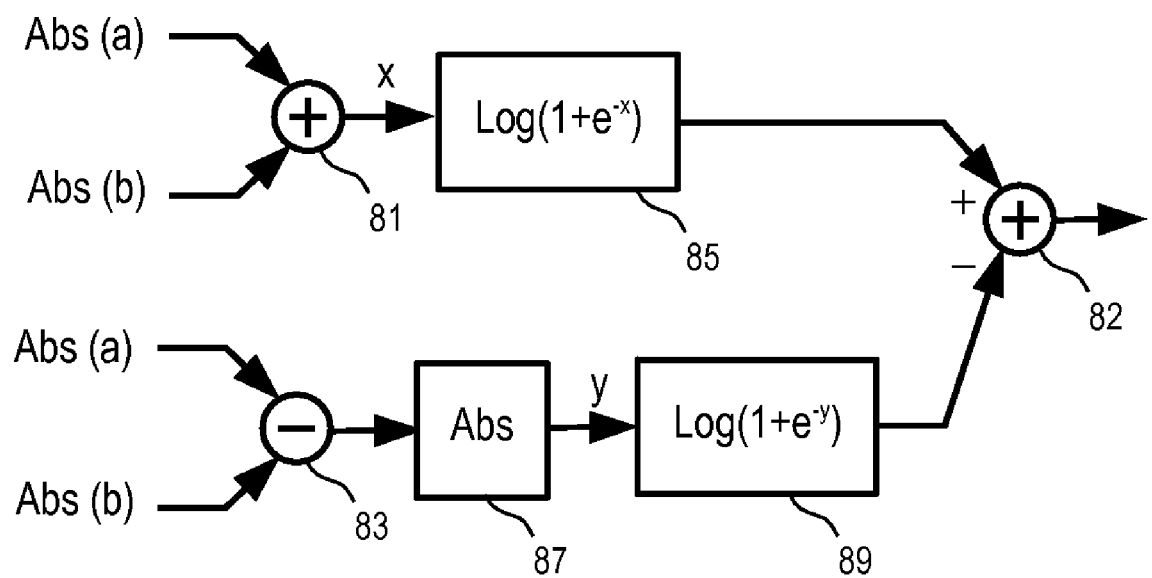

FIGS. 3-4 illustrates an implementation of a function to combine two messages according to one embodiment.

In FIG. 3, two messages (a and b) are combined to generate one resulting message. The signs of the messages, sign(a) and sign(b), are combined via a comparator to generate the sign. If the sign(a) and sign(b) are the same, the comparator (71) outputs a positive sign; otherwise, the comparator (71) outputs a negative sign. Thus, the result of the comparator is equal to sign(a)×sign(b). In some embodiments, the comparator can be implemented via an xor logic unit.

In FIG. 3, the magnitudes (abs(a) and abs(b)) of the messages are combined to generate a value (val). The logic unit (73) determines the minimum of abs(a) and abs(b); and the logic unit (75) determines a value based on a look up table. The adder (77) sums the determined minimum and the value determined via looking up from table memory.

The computed sign and the value (val) are combined to generate the resulting message: sign×val.

FIG. 4 illustrates an implementation of the logic unit (75) according to one embodiment. In FIG. 4, the adder (81) determines the sum of abs(a) and abs(b), denoted as x, which is used in a look up table to determine a value of log(1+exp(−x)). The subtracter (83) and the absolute function (87) determine the absolute difference between abs(a) and abs(b), denoted as y, which is used in the loop up table to determine a value of log(1+exp(−y)). The look up table values are subtracted from each other by adder (82) to generate the output.

In one embodiment, a check node receives a set of incoming messages in which $a_1, a_2, \ldots, a_n$ have magnitudes larger than the predetermined number (lambda) of smallest unique magnitudes of the set, and $b_1, b_2, \ldots, b_m$ are the other incoming messages. An intermediate message is computed according to $$M_1 = g(a_1, a_2, \ldots, a_n)$$

An outgoing message for $b_i$ is computed as $g(M_1, b_1, \ldots, b_{i-1}, b_{i+1}, \ldots, b_m)$, where $i = 1, 2, \ldots, m$.

To compute the outgoing message for $a_i$, the intermediate message is updated to $$M_2 = g(a_1, a_2, \ldots, a_n, b_1, b_2, \ldots, b_m)$$

and the outgoing message for $a_i$ is computed as $M_2 \times \text{sign}(a_i)$.

Here, $g(x_1, x_2, \ldots, x_k) = g(x_1, g(x_2, \ldots, x_k))$ where $k = 3, 4, \ldots$ and $$g(x,y) = \text{sign}(x) \times \text{sign}(y) \times \min(|x|, |y|) + \log(1 + \exp(-|x+y|)) - \log(1 + \exp(-|x-y|))$$

Figure 5:
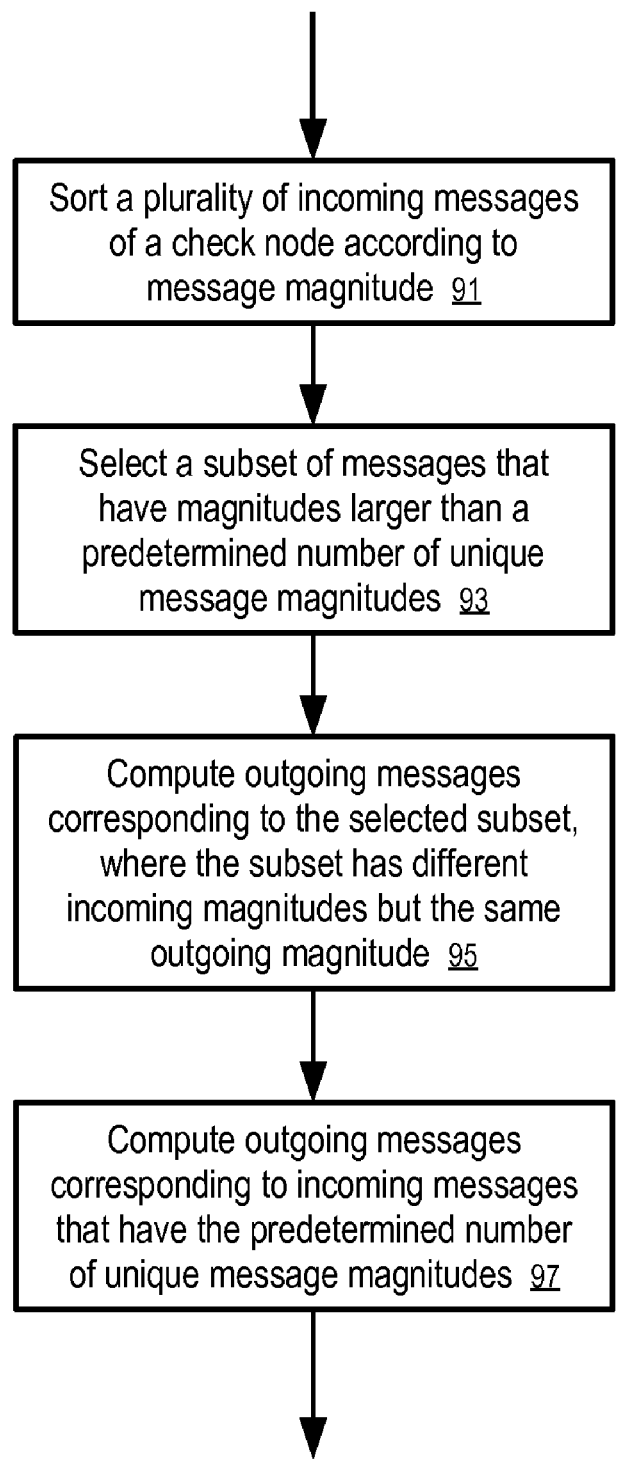
FIG. 5 illustrates a method implemented in a Density Parity Check (LDPC) Decoder according to one embodiment.

FIG. 5 illustrates a method implemented in a Density Parity Check (LDPC) Decoder according to one embodiment. In FIG. 5, a plurality of incoming messages of a check node is sorted (91) according to message magnitude. A subset of messages is selected (93) to have magnitudes larger than a predetermined number of unique message magnitudes in the incoming messages. Outgoing messages corresponding to the selected subset are computed (95). The incoming messages of the subset generally have different magnitudes, but the corresponding outgoing messages are computed to have the same magnitude. Further, outgoing messages corresponding to incoming messages that have the predetermined number of unique message magnitudes are also computed (97).

Consider an example where a check node receives six incoming messages: a, b, c, d, e and f, where |a|<|b|=|c|<|d|<|e|<|f|. When lambda is two, the two minimum values are |a| and |b|=|c|. Thus, the outgoing messages for a, b and c are computed using one formula and the outgoing message for d, e and f are computed using another formula.

In one embodiment, an intermediate message h=g(g(d,e), f) is computed. Then, the outgoing message for incoming message a is determined as $g_a = g(g(h, b), c)$, and $g_b = g((h, a), c)$ for incoming message b, and $g_c = g(g(h, a), b)$ for incoming message c. The incoming message c is then further combined with the outgoing message for c to generate an intermediate message $p=g(g_c, c)$. The outgoing messages for d, e and f are then determined using the intermediate message p as $g_d=p \times sign(d)$, $g_e=p \times sign(e)$, $g_f=p \times sign(f)$ respectively. Since $|b|=|c|$, the magnitude of $g_c$ and $g_b$ are equal to each other. If the sign(c) and sign(b) are the same, $g_c=g_b$; otherwise, $g_c=-g_b$.

In one embodiment, during the computation process, the storage used are for the incoming messages, the temporarily result t or p, the positions of the minimum values.

The methods disclosed herein have less memory usage and complexity than product-sum algorithm and has better error performance than lambda-min algorithm. Thus, embodiments of the disclosure offer better performance with less complexity and memory cost.

In the foregoing specification, the disclosure has been provided with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A Low Density Parity Check (LDPC) decoder, comprising:
   means for sorting a plurality of incoming messages of a check node according to magnitudes of the incoming messages;
   means for identifying a predetermined number of unique message magnitudes from the incoming messages; and
   means for computing outgoing messages for a subset of the plurality of incoming message, messages in the subset having different magnitudes larger than the predetermined number of unique message magnitudes, the outgoing messages having a same magnitude.

2. The decoder of claim 1, wherein the same magnitude of the outgoing messages is equal to a magnitude generated from combining the plurality of incoming messages one after another according to a function.

3. The decoder of claim 2, wherein the function generates a magnitude from a sum of a smaller one of two input message magnitudes and a value computed based on a sum of the two input message magnitudes and a value computed based on a difference in the two input message magnitudes.

4. The decoder of claim 3, wherein the function generates the magnitude that is equal to $min(a, b)+log(1+exp(-a-b))-log(1+exp(a-b))$, wherein a and b represent two input message magnitudes, and wherein a is not smaller than b.

5. The decoder of claim 1, wherein the means for computing the outgoing messages corresponding to the subset comprises:
   means for storing an intermediate result; and
   means for computing each of the outgoing messages from the intermediate result and a sign of a corresponding message of the subset.

6. The decoder of claim 1, further comprising:
   means for determining and storing an intermediate result from combining messages in the selected subset; and
   means for determining outgoing messages for the corresponding incoming messages not in the subset using the intermediate result.

7. A method implemented in a Low Density Parity Check (LDPC) decoder, the method comprising:
   sorting a plurality of incoming messages of a check node according to message magnitude;
   selecting a subset of messages from the plurality of incoming messages according to a predetermined number, the selected subset having message magnitudes larger than the predetermined number of unique message magnitudes of the incoming messages; and
   computing outgoing messages corresponding to the selected subset, messages in the selected subset having different magnitudes, the outgoing messages having a same magnitude.

8. The method of claim 7, wherein the same magnitude of the outgoing messages is equal to a result generated from combining the plurality of incoming messages one after another using a function.

9. The method of claim 8, wherein the function includes generating a result message magnitude from adding a smaller one of two input message magnitudes and a value looked up based on a sum of the two input message magnitudes and a difference in the two input message magnitudes.

10. The method of claim 9, wherein the combining the plurality of incoming message to generate the result comprises using the function to combine two of the incoming messages to generate an intermediate result, which is further combined with another incoming message using the function to generate a further intermediate result.

11. The method of claim 9, wherein the function is equal to $sign(a) \times sign(b) \times [min(|a|, |b|)+log(1+exp(-|a+b|))-log(1+exp(-|a-b|))]$, wherein a and b represent input messages for the function.

12. The method of claim 7, wherein the computing of the outgoing messages corresponding to the selected subset comprises changing a sign of an intermediate result according to signs of messages in the selected subset to generate corresponding outgoing messages.

13. The method of claim 7, further comprising:
   determining an intermediate result from combining messages in the selected subset one after another using a function, where a subsequent message is combined with a previous result generated from combining using the function; and
   determining outgoing messages for the corresponding incoming messages other than the subset using the intermediate result.

14. The method of claim 13, wherein an outgoing message for a first incoming message that is not in the subset is determined without using the first incoming message.

15. A machine readable medium embodying instructions to cause a Low Density Parity Check (LDPC) decoder to perform a method, the method comprising:
   sorting a plurality of incoming messages of a check node according to message magnitude;
   selecting a subset of messages from the plurality of incoming messages according to a predetermined number, the selected subset having message magnitudes larger than the predetermined number of unique message magnitudes of the incoming messages; and
   computing outgoing messages corresponding to the selected subset, messages in the selected subset having different magnitudes, and the outgoing messages having a same magnitude.

16. The medium of claim 15, wherein the same magnitude of the outgoing messages is equal to a result generated from combining the plurality of incoming messages one after another using a function.

17. The medium of claim 16, wherein the function includes generating a result message magnitude from adding a smaller one of two input message magnitudes and a value determined based on looking up from a table according to a sum of the two input message magnitudes and according to a difference in the two input message magnitudes.

18. The medium of claim 15, wherein the computing of the outgoing messages corresponding to the selected subset comprises:
   computing an intermediate result through combining the plurality of messages one after another using a function;
   storing the intermediate result; and
   combining the intermediate result with signs of messages in the subset to generate corresponding outgoing messages for the subset.

19. The medium of claim 18, wherein the function is equal to $\text{sign}(a) \times \text{sign}(b) \times [\min(|a|, |b|) + \log(1+\exp(-|a+b|)) - \log(1+\exp(-|a-b|))]$, wherein a and b represent input messages for the function.

20. The medium of claim 15, further comprising:
   determining an intermediate result from combining messages in the selected subset one after another using a function, where a subsequent message is combined with a previous result generated from combining using the function; and
   determining outgoing messages for the corresponding incoming messages other than the subset using the intermediate result.

* * * * *